United States Patent [19]

Igarashi et al.

[11] Patent Number: 6,104,741
[45] Date of Patent: Aug. 15, 2000

[54] SEMICONDUCTOR LASER LIGHT SOURCE AND SOLID-STATE LASER APPARATUS

[75] Inventors: Kouichi Igarashi; Yasuo Oeda; Kiyofumi Muro, all of Sodegaura, Japan

[73] Assignee: Mitsui Chemicals Inc., Tokyo, Japan

[21] Appl. No.: 09/049,076

[22] Filed: Mar. 27, 1998

[30] Foreign Application Priority Data

Mar. 27, 1997 [JP] Japan ................................. 9-075041

[51] Int. Cl.$^7$ ............................ H01S 3/091; G02B 6/00; G02B 6/32; G02B 6/34
[52] U.S. Cl. ............................... 372/75; 385/11; 385/33; 385/36; 359/494; 359/495
[58] Field of Search .................................. 372/69, 70, 75, 372/101, 105, 106, 43, 44, 66; 385/11, 33, 34, 36; 359/495, 496, 494

[56] References Cited

U.S. PATENT DOCUMENTS

| | | | |
|---|---|---|---|
| 4,253,735 | 3/1981 | Kawamura et al. | 359/668 |
| 5,533,152 | 7/1996 | Kessler | 385/11 |
| 5,612,969 | 3/1997 | Dombi | 372/75 |

FOREIGN PATENT DOCUMENTS

| | | |
|---|---|---|
| 56-122005 | 9/1980 | Japan . |
| 5-683701 | 7/1981 | Japan . |
| 57-129409 | 8/1982 | Japan . |
| 6-076707 | 5/1995 | Japan . |
| 8-307017 | 12/1996 | Japan . |
| 2220501 | 1/1990 | United Kingdom . |

OTHER PUBLICATIONS

"Scalable, end–pumped, diode–laser–pumped laser", T.Y. Fan, A. Sanchez, and W.E. DeFeo, Optics Letters, vol. 14, Oct. 1, 1989, pp. 1057–1059, XP000068907.

*Primary Examiner*—Rodney Bovernick
*Assistant Examiner*—Quyen Phan Leung

[57] ABSTRACT

A semiconductor laser light source includes: a semiconductor laser array which emits laser beams whose polarization planes are parallel to each other and whose divergent angles θz and θx in two orthogonal directions satisfy an inequality θz>θx; a cylindrical lens which converges the laser beams emitted from the semiconductor laser array in a direction that decreases the divergent angle θz; a wave plate which controls the direction of polarization so that the polarization planes of the laser beams having passed through the cylindrical lens are at 90 degrees to each other; a birefringent optical element which merges by the birefringent effect the optical paths of the laser beams having passed through the wave plate; and a light emitting surface which converges the laser beams merged by the birefringent optical element in a direction that decreases the divergent angle θx.

Thus, the efficiency of merging the laser beams and the efficiency of joining the laser beams to the succeeding optical system can be greatly improved.

12 Claims, 3 Drawing Sheets

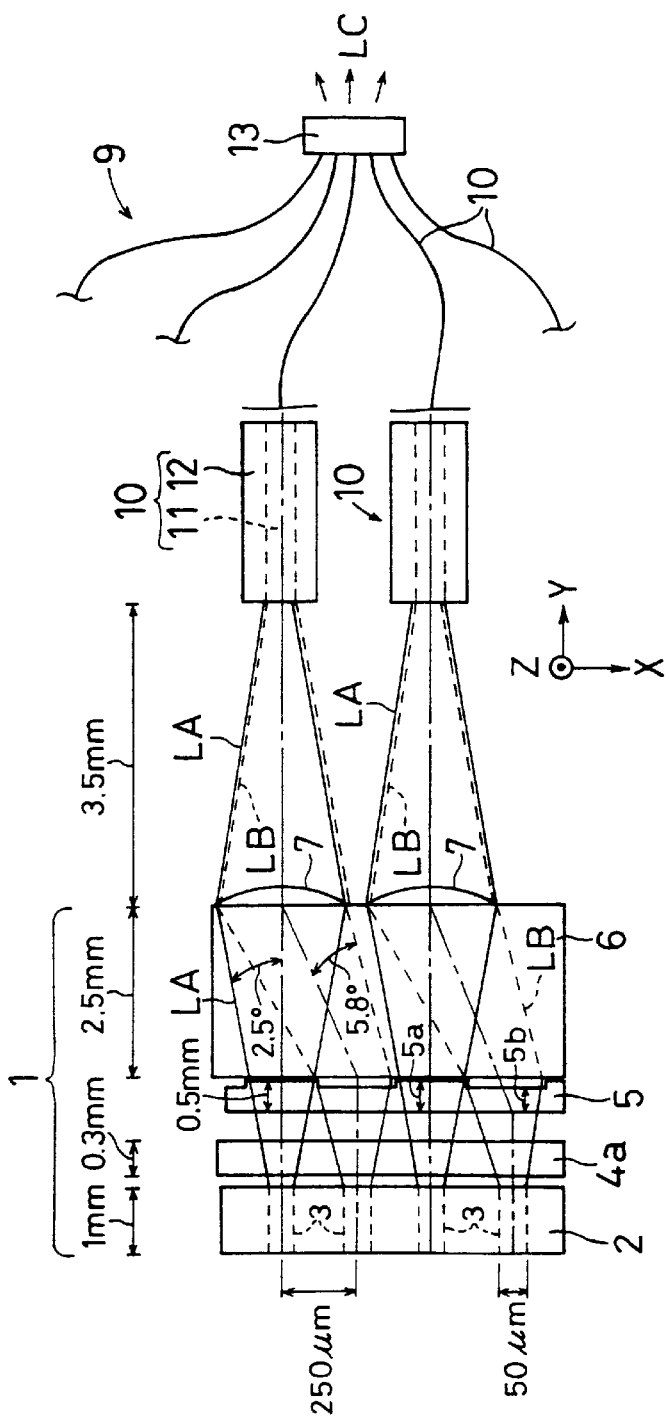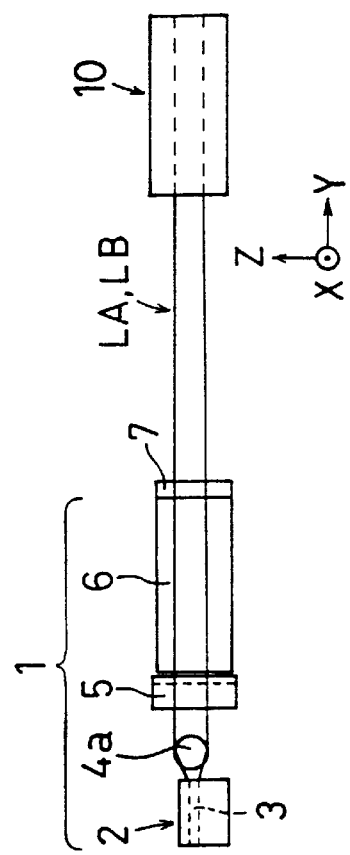
FIG. 3A
FIG. 3B

SEMICONDUCTOR LASER LIGHT SOURCE AND SOLID-STATE LASER APPARATUS

BACKGROUND OF THE INVENTION

1. Field of the Invention

The present invention relates to a semiconductor laser light source designed to integrate a plurality of laser beams, and a solid-state laser apparatus using the same.

2. Description of the Related Art

A semiconductor laser, which is small in size, highly reliable, and easy to maintain as compared with a gas laser, a solid-state laser or the like, is widely used in the optical communication field, optical disk devices and so on. However, the semiconductor laser is still under development in fields which require high-output laser beams such as laser welding and laser scalpel field. The optical output obtained from one semiconductor laser is limited to approximately several milliwatts to several hundreds of milliwatts in CW (constant wave) operation. It is thus quite difficult to apply the semiconductor laser to the aforementioned fields. To deal with this problem, it has been researched to increase the output of laser beam by integrating laser beams from a plurality of semiconductor lasers.

On the other hand, since the laser beam of the semiconductor laser has a great divergent angle, high accuracy is required for the configuration and arrangement of optical elements, so that it is technically quite difficult to integrate a plurality of laser beams. However, in the case where it is made possible that a plurality of laser beams are joined, for example, to one optical fiber, the application range of the semiconductor laser will increase.

As prior art, Japanese Unexamined Patent Publication JP-A 60-76707 (1985) discloses a semiconductor laser duplex module for optical communication, directed to improve the reliability by multiplexing with the following features. An optical system is used which, in order that beams from two semiconductor lasers are caused to enter one optical fiber, rotates the polarization plane of one laser beam 90 degrees and then merges the two laser beams by the birefringence effect, and when one suffers a breakdown, the other continues operation.

However, in the arrangement of JP-A 60-76707, when a semiconductor laser having a great divergent angle is used, since the incident angle on the birefringent element greatly differs between the light in the vicinity of the optical axis and the light diverging outward, the birefringence effect is not uniform, with the result that it is difficult to merge the laser beams. In addition, since the wave fronts of the laser beams are disturbed due to the large variation in the incident angle, it is difficult to converge the beams onto an optical fiber having a small core diameter.

In a semiconductor laser for optical communication which places emphasis on wave length stability and longevity, the above problem does not arise because the divergent angle is not very great. However, in a semiconductor laser for processing which places emphasis on high output and high intensity, the above problem arises because the divergent angle is generally great.

Furthermore, in the prior art, since the optical element for merging the laser beams and the optical element for joining the laser beams to the optical fiber are separately provided, the passage loss of light increases and the overall structure is complicated and increased in size, with the result that the reliability and the productivity decrease.

SUMMARY OF THE INVENTION

An object of the invention is to provide a semiconductor laser light source with which the efficiency of merging laser beams and the efficiency of joining the laser beams to the succeeding optical system are greatly improved.

Another object of the invention is to provide a solid-state laser apparatus in which the output of the excitation beam can be increased by improving the efficiency of merging laser beams and the efficiency of joining the laser beams to the succeeding optical system.

The invention provides a semiconductor laser light source comprising:

first and second semiconductor lasers for emitting laser beams whose polarization planes are parallel to each other and whose divergent angles $\theta a$ and $\theta b$ in two orthogonal directions satisfy an inequality $\theta a > \theta b$;

a cylindrical optical element for converging the laser beams emitted from the first and second semiconductor lasers in a direction where the divergent angle $\theta a$ decreases;

a polarization rotating element for controlling a polarization direction so that the polarization planes of the respective laser beams having passed through the cylindrical optical element form an angle of 90 degrees;

a birefringent optical element for merging by a birefringent effect, optical paths of the respective laser beams having passed through the polarization rotating element; and a converging optical element for converging the laser beams merged by the birefringent optical element in a direction where the divergent angle $\theta b$ decreases.

According to the invention, by disposing the cylindrical optical element in the rear of the first and second semiconductor lasers and converging the laser beams in the direction where the divergent angle $\theta a$ decreases, the light use efficiency is enhanced and the variation in incident angle on the succeeding birefringent optical element can be decreased. Accordingly, the variation in birefringent effect of the laser beams is narrowed, whereby the efficiency of merging the laser beams is enhanced.

Furthermore, by providing the converging optical element, for example, a cylindrical lens and a spherical lens, for converging the laser beams merged by the birefringent optical element in the direction where the divergent angle $\theta b$ decreases, the light use efficiency is enhanced and the two divergent angles $\theta a$ and $\theta b$ are independently controlled by the cylindrical optical element and the converging optical element, so that a small circular convergent light spot can be realized. As a result, the efficiency of joining the laser beams to the succeeding optical system such as an optical fiber can be greatly enhanced.

In the invention it is preferable that the first and second semiconductor lasers respectively oscillate in a transverse multimode.

According to the invention, the transverse multimode semiconductor lasers, which can produce high output even when used alone, contribute to enhancing the output of the laser beam.

In the invention it is preferable that the first and second semiconductor lasers constitute a transverse multimode semiconductor laser array in which a plurality of light emitting regions are formed on a single chip.

According to the invention, by using the semiconductor laser array having a plurality of light emitting regions, light emission characteristics of the respective light emitting regions such as divergent angle, polarization ratio, oscillation wavelength and output are substantially uniform, so that the characteristics of the merged laser beams becomes uniform. Moreover, the transverse multimode semiconductor laser array, which produce high output even when used alone, contribute to enhancing the output of the laser beam.

In the invention it is preferable that the converging optical element is constructed of a curved surface formed integrally with a light emitting surface of the birefringent optical element.

According to the invention, by integrating the converging optical element and the birefringent optical element, the interfacial reflection loss is reduced as compared with the case where the converging optical element and the birefringent optical element are separately formed. Moreover, the assembly and the adjustment are facilitated, with the result that the reliability and the productivity are improved.

In the invention it is preferable that convergence positions of the cylindrical optical element and the converging optical element coincide with each other, and an incident end surface of an optical fiber is situated at the convergence positions.

According to the invention, the spot diameter at the convergence positions can be decreased, whereby the coupling efficiency of the laser beams with the optical fiber is extremely enhanced.

In the invention, it is preferable that the semiconductor laser light source further comprises an optical fiber bundle constructed of a plurality of optical fibers and is arranged so that, on an incident end surface of each optical fiber, laser beams from a couple of light emitting regions of the light emitting regions of the semiconductor laser array enter after being merged with each other.

According to the invention, since the light emitting end surface of the optical fiber bundle is formed as a plane-shaped light source having a predetermined area, a high-output and high-intensity light source can be realized. Thus, the invention is effective for use as an excitation light source of an optically excited solid-state laser and for other uses such as processing, illumination and display.

The invention provides a solid-state laser apparatus comprising:

first and second semiconductor lasers for emitting laser beams whose polarization planes are parallel to each other and whose divergent angles $\theta a$ and $\theta b$ in two orthogonal directions satisfy an inequality $\theta a > \theta b$;

a cylindrical optical element for converging the laser beams emitted from the first and second semiconductor lasers in a direction where the divergent angle $\theta a$ decreases;

a polarization rotating element for controlling a polarization direction so that the polarization planes of the respective laser beams having passed through the cylindrical optical element form an angle of 90 degrees;

a birefringent optical element for merging by a birefringent effect, optical paths of the respective laser beams having passed through the polarization rotating element;

a converging optical element for converging the laser beams merged by the birefringent optical element in a direction where the divergent angle $\theta b$ decreases, and a solid state laser medium which is optically excited by the merged laser beam to perform laser oscillation.

According to the invention, by disposing the cylindrical optical element in the rear of the first and second semiconductor lasers and converging the laser beams in the direction where the divergent angle $\theta a$ decreases, the use efficiency of light is increased and the change in incident angle on the succeeding birefringent optical element is decreased. Accordingly, the variation in the birefringent effect of the laser beams is narrowed, with the result that the efficiency of merging the laser beams is improved.

Furthermore, by providing the converging optical element, for example, a cylindrical or spherical lens, for converging the laser beams merged by the birefringent optical element in the direction where the divergent angle $\theta b$ decreases, the use efficiency of light is increased. In addition, the two divergent angles $\theta a$ and $\theta b$ are separately controlled by the cylindrical optical element and the converging optical element, whereby a small circular convergent light spot can be realized. As a result, the efficiency of coupling the laser beams with the succeeding optical system can be greatly enhanced.

By using the laser beam whose output has been thus increased as the excitation beam of the solid-state laser medium, the laser output of the solid-state laser medium is extremely increased.

Herein a cylindrical optical element indicates an element which is composed of curved or plane surfaces where light incomes and outgoes, which curved or plane surfaces have generating line parallel to each other, and has a focusing power in a direction perpendicular to the generating lines and no focusing power in a direction parallel to the generating lines. Such a lens is given as an example that has one side which is cylindrically shaped and the other side which is shaped into a plane (a semicylindrical lens). A cylindrical lens in which a cross section perpendicular to the generating line is circular can be also given as an example.

In the invention, for the purpose of downsizing the apparatus, it is preferable to use a cylindrical lens as the cylindrical optical element. Since the cylindrical lens has a larger refractive power than a semicylindrical lens, it is possible to reduce the interval between the light emitting portions of the semiconductor laser array and reduce the length of the birefringent optical element in the laser beam transmission direction. As a result, it is possible to reduce the distance to the optical fiber without increasing the NA (numerical aperture) of the optical fiber. For deriving this effect to a larger extent, the upper limit of the diameter of the cylindrical lens is preferably 1 mm, and more preferably 500 $\mu$m. Though the lower limit of the diameter depends on the divergent angle and the divergent distance of the semiconductor laser, from the view of adjustment it is preferably 10 $\mu$m and more preferably 30 $\mu$m.

Furthermore, in the invention, a graded index type cylindrical lens is more preferable in which a refractive index of the periphery is smaller than that of the center portion. By using the graded index type cylindrical lens, spherical aberration can be corrected. Accordingly, wave fronts are seldom disturbed on the surface of the birefringent optical element where the two laser beams emitted from the first and second semiconductor lasers are respectively collimated and overlapped with each other, and the variation in birefringent effect is decreased. As a result, beams are converged to a small spot in a good condition. As the graded index type cylindrical lens, for example, Doric lens (manufactured by Doric Lenses Inc., Canada) can be used.

BRIEF DESCRIPTION OF THE DRAWINGS

Other and further objects, features, and advantages of the invention will be more explicit from the following detailed description taken with reference to the drawings wherein:

FIG. 1A is a plan view, FIG. 1B is a partial front view, and FIG. 1C is a view showing the configuration of an end surface on the light emitting side;

FIGS. 3A and 3B show the structure of another embodiment of the invention, FIG. 3A being a plan view, FIG. 3B being a partial front view.

DETAILED DESCRIPTION OF THE PREFERRED EMBODIMENTS

Figure 1:
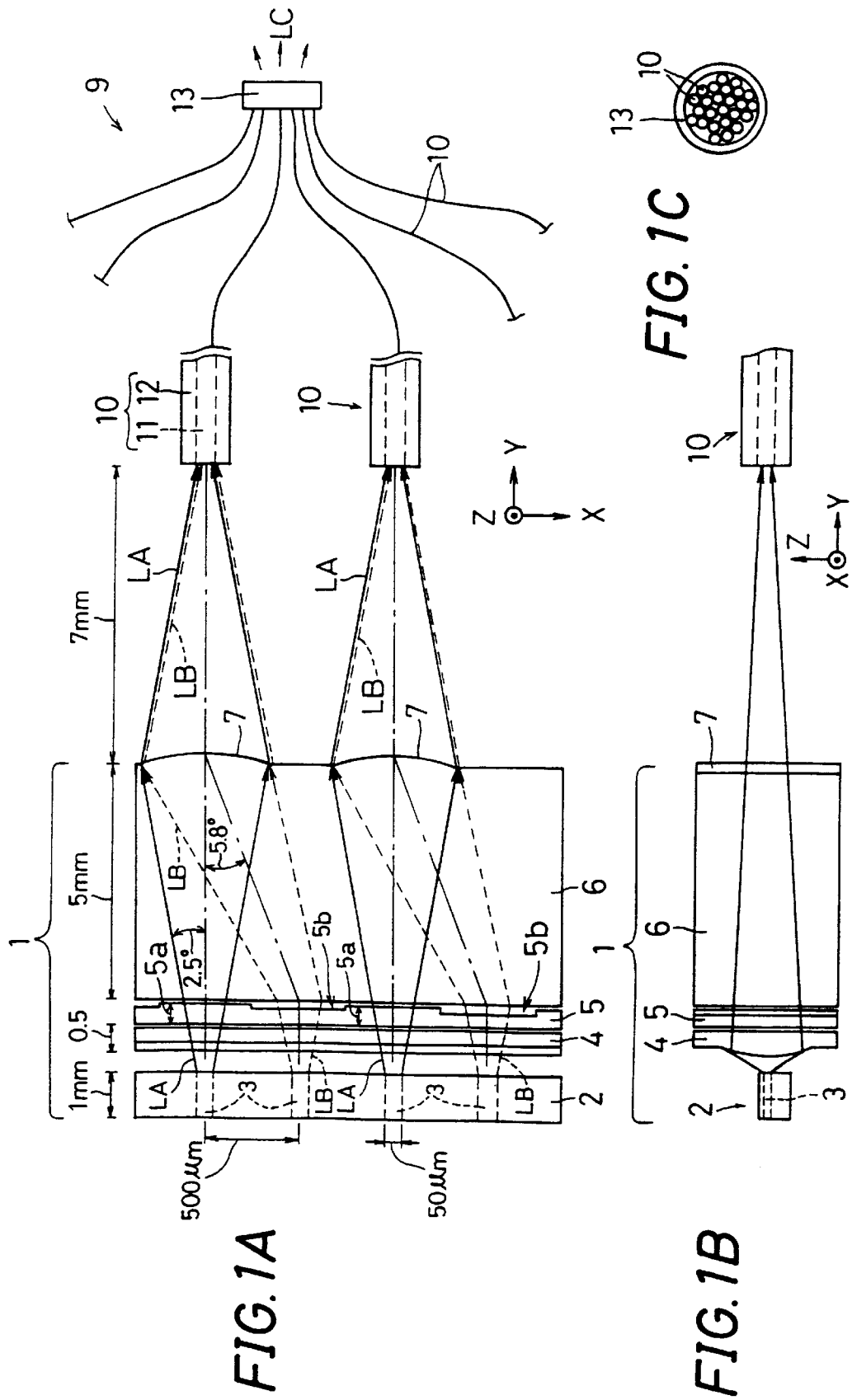
FIGS. 1A to 1C show the structure of an embodiment of the invention.

Now referring to the drawings, preferred embodiments of the invention are described below.

FIGS. 1A to 1C show the structure of an embodiment of the invention. FIG. 1A is a plan view, FIG. 1B is a partial front view, and FIG. 1C is a view showing the configuration of an end surface on the light emitting side. A semiconductor laser light source 9 comprises a semiconductor laser array 2 having a plurality of light emitting regions 3, a cylindrical lens 4 for converging in the Z direction laser beams LA and LB from the light emitting regions 3, a wave plate 5 which is a polarization rotating element for controlling the polarization direction so that the polarization planes of the laser beams LA and LB having passed through the cylindrical lens 4 cross at 90 degrees to each other, a birefringent optical element 6 for merging by the birefringent effect the optical paths of the laser beams LA and LB having passed through the wave plate 5, a light emitting surface 7 formed to be cylindrical for converging in the X direction the laser beams LA and LB passing through the birefringent optical element 6, and a plurality of optical fibers 10 provided at the convergence position of the cylindrical lens 4 and the light emitting surface 7.

The respective optical elements from the semiconductor laser array 2 to the birefringent optical element 6 are fixed onto the same substrate to constitute a light source module 1.

In the semiconductor laser array 2, a plurality of light emitting regions 3 are formed on a single chip having a stripe width of 50 μm, a stripe interval of 500 μm and a resonator length of 1 mm. Each of the light emitting regions functions as a single independent semiconductor laser and generates a high-output laser beam of approximately 1 W in the transverse multimode oscillation. By using the semiconductor laser array 2, light emission characteristics of the light emitting regions 3, for example, the divergent angle, the polarization ratio, the oscillation wavelength and the output are substantially uniform, with the result that the characteristics of the laser beams can be caused to be uniform after the laser beams have been merged with each other.

The laser beams LA and LB from the light emitting regions 3 exhibit an oval intensity distribution in which the angle of divergence is greater in the Z direction which is vertical to the active layer formed parallel to the XY plane. For example, the divergent angle θz in the Z direction is 34 degrees and the divergent angle θx in the X direction is 10 degrees. The laser beams LA and LB are substantially linear polarization immediately after the laser beams LA and LB exited from the light emitting regions 3, and the polarization planes of the laser beams LA and LB are parallel to the active layer.

The cylindrical lens 4 includes a light entering surface which is formed to be a cylindrical surface having a generatrix parallel to the X direction, and a flat light emitting surface. The cylindrical lens 4 converges the laser beams LA and LB from the light emitting regions 3 only in the Z direction and does not converge the laser beams LA and LB in the X direction. By disposing the cylindrical lens 4 in the rear of the semiconductor laser array 2, the light use efficiency is increased and the variation in the angle of incidence on the succeeding birefringent optical element 6 can be reduced, whereby the nonuniformity in the birefringent effect is decreased and the efficiency of merging the laser beams into one is improved.

As the cylindrical lens 4, for example, a cylindrical lens made of molten quartz can be used in which the radius of curvature of the light entering surface is 500 μm, the numerical aperture (NA) is 0.4 and the central thickness is 0.5 mm.

The wave plate 5 is made of a uniaxial crystal or a biaxial crystal in which the refractive index of light differs between in the X direction and in the Z direction. The light emitting surface of the wave plate 5 is formed to have a level difference so that a portion 5a through which the laser beam LA passes and a portion 5b through which the laser beam LB passes are different in thickness. This configuration causes a light phase difference due to a difference in an optical distance, thereby controlling the rotation angle between the polarization planes of the adjoining laser beams LA and LB to be 90 degrees.

The wave plate 5, for example, is made of molten quartz having an extraordinary ray refractive index ne of 1.5380 and an ordinary ray refractive index no of 1.5470. In this wave plate, the thickness of the portion 5a is 0.5 mm, and by forming a recess of 45 μm with respect to the thickness of 0.5 mm in the portion 5b, the portion 5a maintains the plane of polarization as it is. The portion 5b functions as a half-wave plate to rotate the plane of polarization 90 degrees. Consequently, the polarization plane of the laser beam LA passing through the portion 5a remains parallel to the X direction and the polarization plane of the laser beam LB passing through the portion 5b becomes parallel to the Z direction, so that the polarization planes of the laser beams LA and LB become perpendicular to each other. A wave plate can be used in which the polarization plane of the laser beam LA is rotated 90 degrees and the polarization plane of the laser beam LB is maintained as it is by adjusting the thickness of the portions 5a and 5b. Moreover, the wave plate 5 can be designed so that the polarization plane of one laser beam is rotated +45 degrees and the polarization plane of the other laser beam is rotated −45 degrees.

The birefringent optical element 6 is made of a birefringent crystal, for example, $YVO_4$ crystal (having an extraordinary ray refractive index ne of 2.20 and an ordinary ray refractive index no of 2.0) which is cut out in a direction at 45 degrees to the C-axis. By the birefringent effect, the laser beam LA travels in a straight line as an ordinary ray in a direction parallel to the Y direction, and the laser beam LB travels in a slanting direction as an extraordinary ray because a beam walkoff of approximately 5.8 degrees to the Y direction is caused within the XY plane. The divergent angles of the laser beams LA and LB in the birefringent optical element 6 are both approximately 2.5 degrees.

Thus, the optical paths of the laser beams LA and LB which are separated by a predetermined space at the light entering surface are crossed by the travel of the laser beam LB in the slanting direction. The length of the birefringent optical element 6 is adjusted so that the crossing position coincides with the light emitting surface. In this embodiment, the length thereof is 5 mm.

The light emitting surface 7 has a generatrix parallel to the Z direction and is provided with a function equal to that of a cylindrical lens as a result of being formed to be a cylindrical surface having a radius of curvature of, for example, 5 mm. The light emitting surface 7 converges the laser beams LA and LB only in the X direction and does not converge the laser beams LA and LB in the Z direction. At the light emitting surface 7, the beam walkoff in the laser beam LB is dissolved by approximately 5.8 degrees, whereby the laser beams LA and LB overlap with each other to exit in a direction parallel to the Y direction. The laser beams LA and LB thus merged enter one optical fiber 10.

It is preferable that the convergence position in the X direction by the light emitting surface 7 and the convergence position in the Z direction by the cylindrical lens 4 coincide with each other. For example, the imaging magnification βx of the light emitting surface 7 is set to substantially equal magnification and the imaging magnification βz of the cylindrical lens 4 is set to 10 to 30 magnifaction. With this configuration, even when the laser beams are different in the divergent angle in the orthogonal directions, a small circular convergent light spot can be realized at the convergence position, with the result that the efficiency of joining the laser beams to the optical fiber 10 which is a succeeding optical system can be improved. Moreover, by incorporating the function of the converging lens into the light emitting surface 7 of the birefringent optical element 6, the interfacial reflection loss is reduced compared with the case where the light emitting surface 7 and the function of the converging lens are separately provided. Accordingly, the assembly and the adjustment are facilitated, and the reliability and the productivity are improved.

The optical fiber 10 comprises a core 11 having a diameter of, for example, 60 μm and a cladding 12 covering the core 11. The numerical aperture NA is 0.14. The light incident end surface of the optical fiber 10 is situated approximately 7 mm in the rear of the light emitting surface 7 of the birefringent optical element 6.

Thus, a plurality of optical fibers 10 are disposed which are joined by the adjoining laser beams LA and LB. The light emitting ends of the optical fibers 10 are bundled by a ring-form bundling member 13 so that the optical fibers 10 constitute one optical fiber bundle as shown in FIG. 1C. The optical fiber bundle is used as a single plane light source for generating a laser beam LC. For example, by using the semiconductor laser array 2 having twenty light emitting regions 3 with an output of 1 W, and using ten semiconductor optical fibers, a light source is obtained which generates the laser beam LC with an output of approximately 14 W even when the optical loss on the way is considered. This constitution improves the applicability of the semiconductor laser in the laser beam machining.

Figure 2:
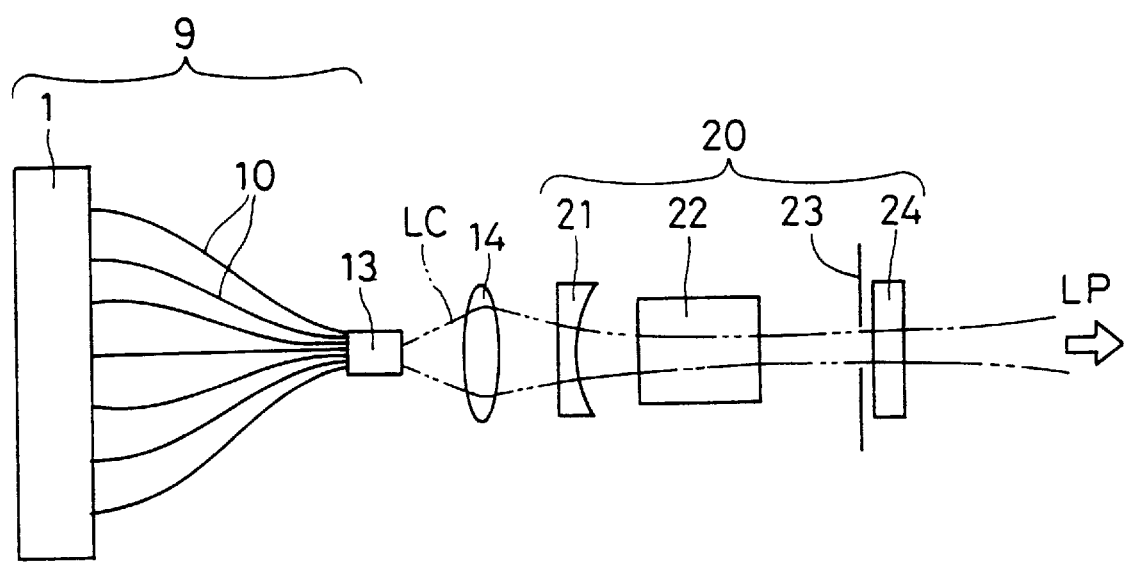
FIG. 2 is a view showing the structure of a solid-state laser apparatus according to the invention.

FIG. 2 is a view showing the structure of a solid-state laser apparatus according to the invention. The solid-state laser apparatus comprises the semiconductor laser device 9 described with reference to FIG. 1, a lens 14 for converging the laser beam LC generated from the semiconductor laser device 9, and a solid-state laser unit 20 which performs laser oscillation as a result of being optically excited by the laser beam LC.

The solid-state laser unit 20 includes a solid-state laser medium 22 which forms inverted population as a result of being optically excited by the laser beam LC serving as the excitation beam, a concave mirror 21 exhibiting a high transmittance for the wavelength of the laser beam LC and a high reflectance for the oscillation wavelength of the solid-state laser medium 22, a plane mirror 24 exhibiting a reflectance of 95% for the oscillation wavelength of the solid-state laser medium 22, and an aperture 23 which limits the lateral mode of the oscillation beam.

For instance, a laser beam LP having a wavelength of 1,064 nm and an output of approximately 7.5 W can be obtained when the wavelength of the laser beam LC is 810 nm, the solid-state laser medium 22 comprises Nd:YAG crystal which is doped with 1.1 at % (atomic percent) of Nd and has an oscillation wavelength of 1,064 nm, the aperture diameter of the aperture 23 is 250 μm and the length of the optical resonator comprising the concave mirror 21 and the plane mirror 24 is 100 mm.

It is clear that, by merging a plurality of laser beams emitted from the semiconductor laser array 2 from two into one by the birefringent effect and bundling the optical fibers 10, a single high-output excitation light source can be obtained. By optically exciting the solid-state laser medium 22, the laser oscillation output of the solid-state laser medium 22 is greatly increased.

FIG. 3 shows the structure of another embodiment of the invention. FIG. 3A is a plan view, and FIG. 3B is a partial front view. The whole structure of this embodiment is similar to that explained in FIG. 1, while in this embodiment a cylindrical lens 4a of graded index type (e.g. Doric lens having a diameter of 300 m, manufactured by Doric Lenses Inc., Canada) is used as the cylindrical optical element in place of the cylindrical lens 4 of FIG. 1. Since the cylindrical lens is used as the cylindrical lens, as shown in FIG. 3B, it is possible to reduce the distance between the optical fiber 10 and the semiconductor laser array 2 without increasing the NA of the optical fiber 10. To achieve the structure of this embodiment, the interval between the light emitting portions 3 is set to 250 μm, the length of the birefringent optical element 6 is set to 2.5 mm, the radius of curvature of the cylindrical surface of the light emitting surface 7 is set to 2.5 mm, and the distance between the birefringent optical element 6 and the optical fiber 10 is set to 3.5 mm. Because other conditions and operations are similar to those in FIG. 1, explanations thereof will be omitted. With the use of the cylindrical lens 4a as described above, it is possible to reduce the length of the semiconductor laser along the light transmission direction to a half of that in FIG. 1 while holding the NA of the optical fiber 10 at 0.14 the same as that in FIG. 1.

Further, in the case of using such cylindrical lens 4a, merging of the laser beams LA and LB in the birefringent optical element 6 can be further efficently carried out by converging the laser beams LA and LB from the light emitting regions 3 of the semiconductor array 2 in the Z direction.

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser light source comprising:
   first and second semiconductor lasers for emitting laser beams whose polarization planes are parallel to each other and whose divergent angles θa and θb in two orthogonal directions satisfy an inequality θa>θb;
   a cylindrical optical element for converging the laser beams emitted from the first and second semiconductor lasers in a direction wherein the divergent angle θa selectively decreases;
   a polarization rotating element for controlling a polarization direction so that the polarization planes of the respective laser beams having passed through the cylindrical optical element form an angle of 90 degrees;
   a birefringent optical element for merging by a birefringent effect, optical paths of the respective laser beams having passed through the polarization rotating element; and a converging optical element for converging the laser beams merged by the birefringent optical element in a direction wherein the divergent angle θb decreases.

2. The semiconductor laser light source of claim 1, wherein the first and second semiconductor lasers respectively oscillate in a transverse multimode.

3. The semiconductor laser light source of claim 2, wherein the converging optical element is constructed of a curved surface formed integrally with a light-emitting surface of the birefringent optical element.

4. The semiconductor laser light source of claim 2, wherein convergence positions of the cylindrical optical element and the converging optical element coincide with each other and an incident end surface of an optical fiber is situated at the convergence positions.

5. The semiconductor laser light source of claim 1, wherein the first and second semiconductor lasers constitute a transverse multimode semiconductor laser array in which a plurality of light emitting regions are formed on a single chip.

6. The semiconductor laser light source of claim 5, wherein the converging optical element is constructed of a curved surface formed integrally with a light-emitting surface of the birefringent optical element.

7. The semiconductor laser light source of claim 5, wherein convergence positions of the cylindrical optical element and the converging optical element coincide with each other, and an incident end surface of an optical fiber is situated at the convergence positions.

8. The semiconductor laser light source of claim 1, wherein the converging optical element is constructed of a curved surface formed integrally with a light emitting surface of the birefringent optical element.

9. The semiconductor laser light source of claim 8, wherein convergence positions of the cylindrical optical element and the converging optical element coincide with each other, and an incident end surface of an optical fiber is situated at the convergence positions.

10. The semiconductor laser light source of claim 1, wherein convergence positions of the cylindrical optical element and the converging optical element coincide with each other, and an incident end surface of an optical fiber is situated at the convergence positions.

11. The semiconductor laser light source of claim 10, wherein said optical fiber is an optical fiber bundle constructed of a plurality of optical fibers and arranged so that, on an incident end surface of each optical fiber, laser beams from a couple of light emitting regions of the light emitting regions of the semiconductor laser array enter after being merged with each other.

12. A solid-state laser apparatus comprising:

first and second semiconductor lasers for emitting laser beams whose polarization planes are parallel to each, other and whose divergent angles θa and θb in two orthogonal directions satisfy an inequality θa>θb;

a cylindrical optical element for converging the laser beams emitted from the first and second semiconductor lasers in a direction wherein the divergent angle θa selectively decreases;

a polarization rotating element for controlling a polarization direction so that the polarization planes of the respective laser beams having passed through the cylindrical optical element form an angle of 90 degrees;

a birefringent optical element for merging by a birefringent effect, optical paths of the respective laser beams having passed through the polarization rotating element;

a converging optical element for converging the laser beams merged by the birefringent optical element in a direction wherein the divergent angle θb decreases; and a solid state laser medium which is optically excited by the merged laser beam to perform laser oscillation.

* * * * *